United States Patent [19]

Sokolovsky

[11] 4,331,077

[45] May 25, 1982

[54] PRINTING ELEMENT WITH SHOCK ABSORBER FEATURE

[75] Inventor: Paul J. Sokolovsky, Sunnyvale, Calif.

[73] Assignee: Advanced Micro Devices, Inc., Sunnyvale, Calif.

[21] Appl. No.: 88,890

[22] Filed: Oct. 29, 1979

[51] Int. Cl.³ .............................. B41F 1/04; B41F 1/56
[52] U.S. Cl. ................................. 101/298; 101/93.02; 101/334; 101/379; 400/167; 188/266; 188/381
[58] Field of Search .................. 188/129, 83, 1 B, 67, 188/266; 101/93.02, 93.04, 379, 334, 298; 400/457, 157.3, 166, 167, 427, 435, 437

[56] References Cited

U.S. PATENT DOCUMENTS

| | | | |
|---|---|---|---|
| 1,248,184 | 11/1917 | Silverstene | 101/334 |
| 1,967,436 | 7/1934 | Going | 400/435 |
| 2,204,187 | 6/1940 | Ostler | 101/93.02 |
| 2,314,677 | 3/1943 | Young | 400/457 |
| 3,554,327 | 1/1971 | Takamura et al. | 188/83 |
| 3,860,096 | 1/1975 | Manners-Smith et al. | 188/83 |
| 3,943,793 | 3/1976 | Stedman | 188/1 B |
| 4,018,154 | 4/1977 | Matsumoto et al. | 101/93.02 |
| 4,060,029 | 11/1977 | Marshall | 101/93.02 |
| 4,083,060 | 6/1978 | Lange | 188/83 |

Primary Examiner—William Pieprz
Attorney, Agent, or Firm—J. Ronald Richbourg; Gary T. Aka

[57] ABSTRACT

A marking element assembly including a yoke which is driven by an arm. The arm is connected to a slider block which transfers motion to the yoke. The yoke has an interior channel for slider block free motion, with drag, after a marking element connected to the yoke stops yoke motion. The slider block moves against interior walls of the yoke dissipating arm motion and providing shock absorption for the marking element.

9 Claims, 4 Drawing Figures

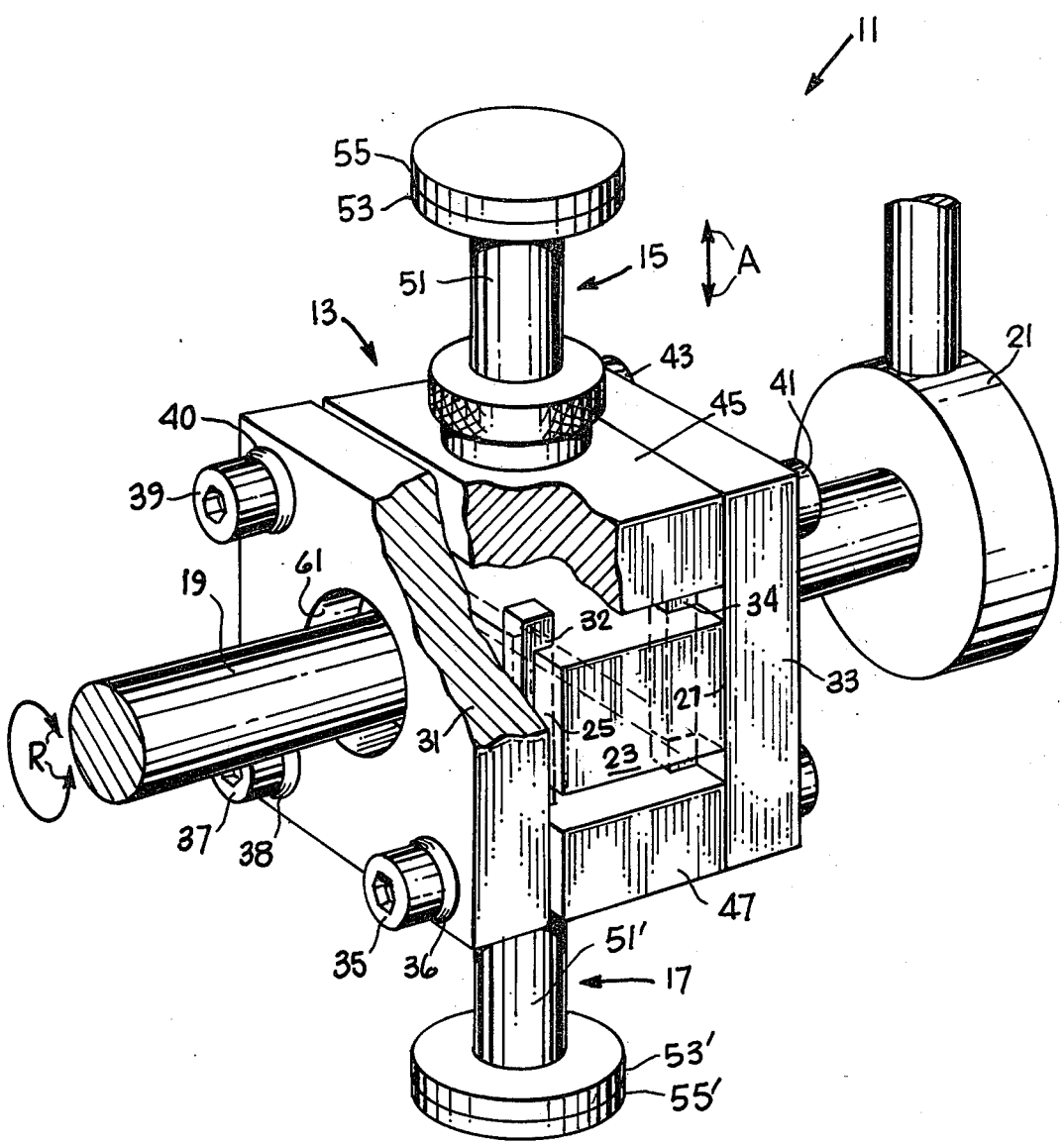

PRINTING ELEMENT WITH SHOCK ABSORBER FEATURE

BACKGROUND OF THE INVENTION

1. Field of the Invention

The invention relates to printing and marking elements and in particular, to a printing and marking element having a shock absorption mechanism.

2. Prior Art

In some printing and marking systems, the objects which are printed upon are fragile and subject to damage by the printing system. While methods for printing on paper are well known, methods for printing on other materials, such as onto goods, are not well known. The reasons for printing directly onto goods vary, but may include the necessity to apply model designations, trademarks, copyright notices, serial numbers, warnings, cleaning or maintenance instructions, country of origin designation or the like. The alternative to printing directly onto goods is to print labels and affix labels to the goods. However, labels are often not permanent despite efforts to make them so.

In the semiconductor industry there is a need to mark housings for transistors and integrated circuits with some of the information mentioned above. Machines have been developed for this purpose which have printing elements which transfer ink obtained from a die directly onto the semiconductor container in one stroke. One such machine has two marking elements, each mounted on opposite ends of a shaft. On an upstroke, the upper element contacts a die and receives ink, after which the downstroke is commenced. Approximately midway through the downstroke the shaft is rotated about a horizontal axis so that the upper element is now coming downward for contacting a housing. The downstroke continues for a predetermined distance, the extent of which is sufficient to permit the marking element to come into contact with the object housing. The marking element in such machines is a pad which serves not only to momentarily retain ink transferred from the die, but also to provide a slight amount of shock absorption.

One problem experienced in the semiconductor industry in using this type of marking machine is that the shock absorption character of the marking pad is insufficient to protect some of the fragile semiconductor housings which are used. For example, ceramic housings are favored in those applications where high temperatures are expected. A ceramic housing is quite brittle compared to a plastic housing, yet is much more expensive than plastic. It has been found that ceramic housings are subject to cracking under the impact of a marking machine. Sometimes these cracks are discovered by optical inspection by a marking machine operator, but in other instances the cracks are microscopic and are only discovered after failure of a device in the hands of a customer, even after final inspection and testing indicate a good part. Replacement of a device in the hands of a customer is very time consuming and expensive both for the customer and the manufacturer.

Accordingly, it is an object of the present invention to devise a printing and marking element for use with fragile goods and other items.

SUMMARY OF THE INVENTION

The above object has been achieved in a printing and marking element by providing a shock absorbing yoke for a marking element. The yoke features a zone for allowing relative free motion of the element with respect to the yoke. The yoke receives energy for reciprocal motion involved in printing from an arm. A slider block, transferring power from the arm to the yoke, moves within the yoke with an adjustable amount of drag. This allows the printing element, which is fixed relative to the yoke, to remain at rest after gently contacting the printed object, with the slider block continuing motion in the yoke, dissipating the remaining driving impact.

There are three principal benefits realized by this invention. First, fragile objects and goods, specifically housings for integrated circuits are not cracked or damaged by marking or printing. Second, the marking or printing machine receives less wear due to less reaction to the impact against the printed object. Third, the printing or marking machine does not have to be perfectly aligned with the printed object for good quality printing, i.e., there is less blurring of the print.

BRIEF DESCRIPTION OF THE DRAWINGS

FIG. 1 is a perspective, partial cutaway view of a marking or printing element assembly in accord with the present invention.

DESCRIPTION OF THE PREFERRED EMBODIMENT

Figure 4:
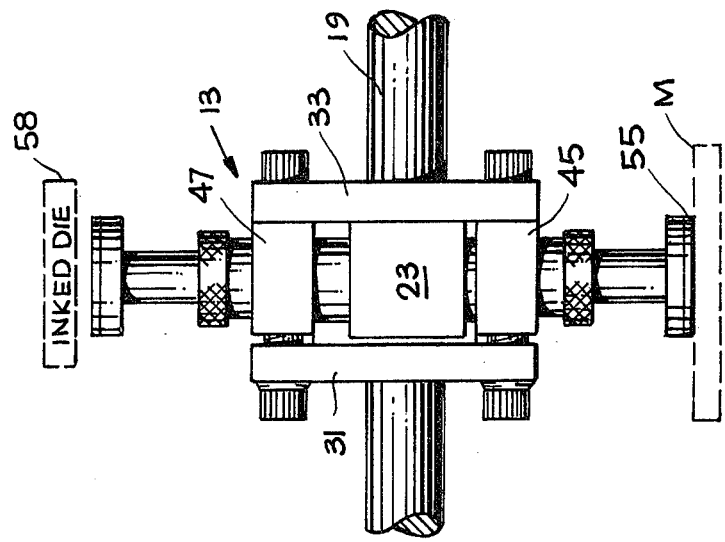
FIG. 4 is a front elevation of the marking or printing element assembly shown in FIG. 3.

With reference to FIG. 1 a marking element assembly 11 is shown. This assembly features a yoke 13 having connected marking elements 15 and 17. The marking elements are moved up and down in a direction indicated by the arrowheads A and rotated in the direction indicated by the arrowheads R. The manner of motion will be explained below.

The assembly further includes a driving arm 19 for causing both the up and down motion and the rotational motion mentioned above. Force is transmitted to the driving arm 19 by means of at least one driving journal 21 which transmits both the rotational force and the up and down motion. Power is applied to the journal 21 by an external motor. The manner of applying power to a marking element assembly 11 is well known. For example, a machine sold by Markem Corporation of New Hampshire employs marking elements similar to marking elements 15, 17 shown herein. Power is transmitted to a yoke holding the marking elements by means of arm 19 and journal 21.

The difference between the prior art and the present invention is the provision of a shock absorbing element in the present invention. Shock absorption is achieved by the novel yoke of the present invention. This yoke features the slider block 23 which is connected to driving arm 19. The slider block may be a solid mass of material having a keyed hole therethrough, into which arm 19 snugly fits. A key on arm 19 fits into the keyed hole. Slider block 23 has side edges, 25, 27 such that the slider block can move vertically in the direction indicated by the arrowheads A between the inside of the yoke sidewalls 31, 33. The width of slider block 23 is slightly greater than the width of the top wall 45 and bottom wall 47 of yoke 13, both of which have equal widths. The fact that slider block 23 has a slightly wider width, say by 1 mm, places the slider block in a position to readily contact the sidewalls.

Support for the slider block is achieved by means of vertical rails 32, 34 which are integrally formed on the inside surfaces of the opposed sidewalls 31, 33, respectively, in order to maintain the slider block 23 in the proper orientation. These rails define the path for slider block vertical motion within the yoke. The rails extend through grooves defined on opposite sides of the block. Slider block 23 is made of metal and the edges 25, 27 are generally lubricated to promote sliding action, even though drag is applied to the slider block.

The opposed walls 31, 33 of the yoke can be brought into close proximity to the slider block by means of screws 35, 37, 39, plus a fourth screw not shown, on one side. These screws extend through the sidewall 31 of the yoke into opposite top and bottom walls. For example, the screws 35, 37 are threaded into bottom wall 47, while screw 39 and the fourth screw (not shown) extend into the top wall 45. Between the head of each screw and the screw shank, not shown, is a spring washer. For example, the screws 35, 37, 39 have the spring washers 36, 38, 40 respectively between the screw head and shank of the washer such that the spring washer exerts force between the screw head and the sidewall of the yoke.

Since the screw shank extends into either a top wall or a bottom wall of the yoke, the spring allows a magnification pressure to be exerted between a sidewall, through which the screw is connected, and a top or bottom wall. This magnification permits careful turning of the screws such that the pressure between sidewall 31 on the one hand and the top and bottom walls 45 and 47, on the other hand, to be carefully controlled. This allows for gradual adjustment of the sidewall drag against slider block 23 such that a desired amount of drag may be readily achieved. The spring washers 36, 38, 40 need only be positioned on screws extending into one of the sidewalls. It is generally easier to make drag adjustments from only one side of the yoke. These spring washers define a pressure means for varying sidewall spacing relative to the slider block whereby the amount of sliding friction contact between the sidewalls and the slider block may be varied. Screws 41, 43 and two other screws, not shown, at the bottom of sidewall 33 secure the sidewall to the top and bottom walls 45 and 47. The screws are fasteners and not used for drag adjustments.

The marking elements 15 and 17 are fixed with respect to the top and bottom walls 45 and 47. In other words, the marking element 15 is fixed with respect to top wall 45, while marking element 17 is fixed with regard to bottom wall 47. The marking elements have identical constructions which include central shafts 51, 51' which are rigid and usually made of metal. Pad backing members 53, 53' are connected to the respective shafts 51, 51'. Adhesively connected to the backing members 53, 53' are ink retaining pads 55, 55' respectively, which are somewhat resilient and may have some shock absorption qualities, especially if made from an elastomeric material such as rubber.

The driving arm 19 extends through hole 61 defined in the sidewall 31 and is connected to slider block 23, as previously mentioned. The hole 61 is oversize relative to the diameter or thickness of driving arm 19. For example, the diameter of hole 61 may be 50% greater than the diameter of driving arm 19. The exact extent to which the diameter of hole 61 is oversize depends upon the amount of free motion that is desired. The arm 19 emerges through a similar hole, not visible, in the sidewall 33. Preferably, driving arm 19 is a single metal bar which extends completely through yoke 13. A single bar is not necessary since two parallel colinear bars could be joined within slider block 23. It should be noted that the hole 61 is circular, merely as a matter of convenience. The hole could be elliptical, elongated in the vertical direction with opposite elliptical ends which are sufficiently wide to accommodate the driving arm 19 within the opposite ends.

In operation, the marking elements 15 and 17 move upward in unison in the direction indicated by the top arrowhead A until the pad 55 contacts an ink transfer die, not shown, which places an ink pattern on pad 55 corresponding to a mark to be made. The steel transfer die, containing the indicia to be marked receives ink from an inked roller. The die and roller are represented diagrammatically by the block 58, labeled "inked die" in FIGS. 2–4. The ink pattern transfer from the die to pad 55 may be any combination of letters, symbols, or other marks which can be formed on a die. Such dies and ink transfer methods are well known. Pad 55 is adjusted to contact the die lightly such that the slider block is centered in the yoke. Centering of the slider in the vertical direction is desirable in order to reset the slider block for the next down stroke. Only a light inking of pad 55 is required on the upstroke. This is unlike the downstroke in which firm contact with the marked object is required.

After ink is received by pad 55, the yoke is rotated about the axis of symmetry of arm 19. This rotational force may be transmitted to arm 19 by means of a gear, not shown, on the far side of journal 21. A cam, not shown, on the side of arm 19 opposite journal 21 has detents which index the rotational position of arm 19 such that the marking elements 15 and 17 will be vertically aligned. Rotation of yoke 13 is achieved at the beginning of a down stroke such that the pad 55 which has just received ink, now faces a device to be marked. This situation is shown in FIG. 2.

Figure 2:
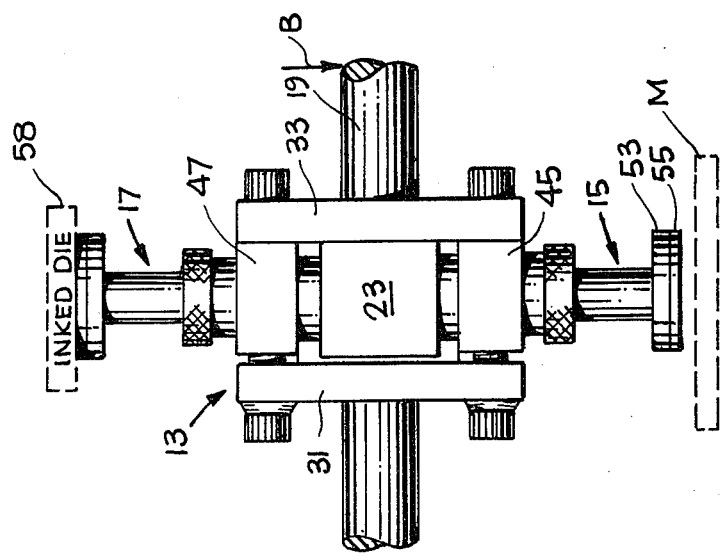
FIG. 2 is a front elevation of the marking or printing element of FIG. 1, shown in a raised position at the commencement of a downstroke.

With reference to FIG. 2, pad 55 is travelling in a downward direction indicated by the arrow B toward the article to be marked M. The slider block 23 is in a relatively low position after rotation and ready to be pushed upward by the reaction of the yoke 13 after impact of the pad 55 on the article M.

Figure 3:
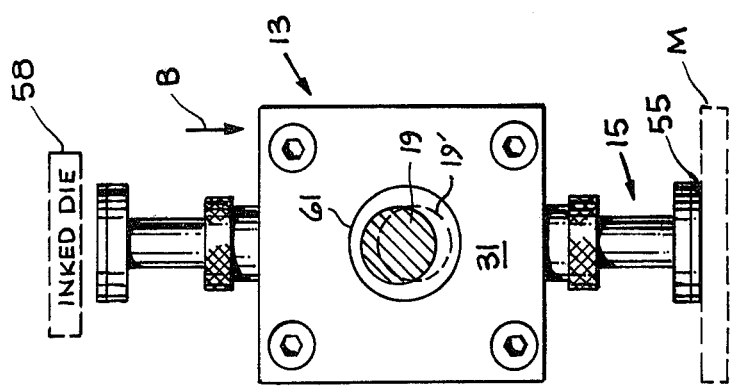
FIG. 3 is a side elevation of the marking or printing element of FIG. 1, shown in a shock absorbing position at the bottom of a downstroke.

In FIG. 3, the pad 55 has continued motion in the direction indicated by the arrow B, until coming into contact with the article M. After making contact, marking element 15 stops, but arm 19 continues its downward motion, with the slider block in sliding friction contact with the sidewalls of the yoke. Arm 19 is initially approximately centered in hole 61 when contact is first made by the pad 55 with the article M, but as the arm moves downward, it assumes the position indicated by the dashed line 19'. This position may be seen more clearly with reference to FIG. 4.

In FIG. 4 slider block 23 is shown to be at its lowermost position between the opposed sidewalls 31, 33 of yoke assembly 13. At this points, downward force has ceased and the yoke 13 has been successful in dissipating the downstroke energy after the pad 55 has contacted the object M. Upward motion will now occur which will center the yoke with respect to the arm 19 after contact with the inked die such that the slider block 23 is approximately midway between the walls 45 and 47. A yoke rotation then follows. The yoke assembly after rotation is in the position shown in FIG. 1.

While the preferred embodiment has been described with reference to a single yoke, a plurality of similar yokes could be arranged on an arm 19 for simultaneously marking a plurality of parallel articles.

What is claimed is:

1. A marking element assembly comprising,
   a reciprocating motion source providing motion to and from an object to be marked,
   a yoke connected to said motion source having a yoke shaft mounted therein, said yoke shaft carrying a marking element projecting outwardly from said yoke toward said object to be marked, and
   a shock absorption means including a slider block connecting said motion source to said yoke for fixing the position of said yoke shaft relative to said motion source when said marking element is not in contact with an object to be marked and freeing said yoke and yoke shaft for motion relative to said motion source when said marking element is in contact with an object to be marked, said slider block movable within said yoke in an interior channel thereof defined by sidewalls of the yoke, the slider block having surfaces for sliding friction contact with opposed yoke sidewalls, said opposed yoke sidewalls including pressure means for varying sidewall spacing relative to said slider block whereby the amount of sliding friction contact between said sidewalls and said slider block may be varied, whereby energy from said motion source is dissipated in said shock absorption means after contact between the marking element and the object.

2. The assembly of claim 1 wherein said pressure means for varying the sidewall spacing comprises at least two adjustable screws through one of said sidewalls, said screws disposed on vertically opposite sides of the yoke beyond the path of relative motion of the slider block with respect to the screws.

3. The assembly of claim 2 wherein said screws have springs mounted thereon for variable friction adjustment between said sidewalls and said slider block.

4. The assembly of claim 1 wherein said reciprocating motion source is connected to said slider block by an arm extending through central apertures defined in sidewalls of said yoke, the thickness of said arm being less than the dimension of said apertures in the direction of reciprocating motion so that said yoke is free to move relative to said arm for shock absorber action.

5. The assembly of claim 1 further defined by top and bottom walls for said yoke positioned between said opposed yoke sidewalls, the width of said slider block slightly exceeding the width of said top and bottom walls.

6. A marking element assembly comprising,
   a yoke having opposed, spaced apart parallel sidewalls at least one of which defines a central aperture therein having a first dimension, a slider block having opposed surfaces in close proximity to and parallel to said sidewalls for sliding friction contact therewith in a direction aligned with an object to be marked, said slider block mounted for back and forth motion within said yoke, and a yoke shaft having a marking element mounted at an end projecting outwardly from said yoke toward an object to be marked,
   pressure means acting on said sidewalls and said slider block and being disposed for varying sidewall spacing relative to said slider block whereby the amount of sliding friction contact between said sidewalls and said slider block may be varied, and
   a driving arm projecting through said central aperture in a sidewall of said yoke and connected to said slider block, said driving arm having a lesser dimension than said first dimension whereby relative motion between said slider block and said yoke is possible, said driving arm transmitting reciprocating motion thereto along the direction from the yoke toward an object to be marked, whereby said slider block and yoke remain fixed relative to an object to be marked before impact, but move with sliding friction contact relative to said yoke sidewalls in a shock absorption relation after impact.

7. The assembly of claim 6 wherein each of said sidewalls defines a central aperture with a first dimension and having a driving arm projecting therethrough and connected to said slider block, each driving arm having a lesser thickness dimension than said first dimension whereby relative motion between said slider block and said yoke corresponds to motion of said driving arm within said central aperture.

8. The assembly of claim 6 further defined by top and bottom walls for said yoke positioned between said opposed yolk sidewalls, the width of said slider block slightly exceeding the width of said top and bottom walls.

9. The assembly of claim 8 wherein said pressure means comprises at least two adjustable screws connecting said yoke sidewalls to yoke top and bottom walls, said screws disposed on vertically opposite sides of the yoke beyond the path of relative motion of the slider block with respect to the screws.

* * * * *